(12) United States Patent
Chen et al.

(10) Patent No.: US 7,990,719 B2
(45) Date of Patent: Aug. 2, 2011

(54) ELECTRONIC SYSTEM WITH HEAT DISSIPATION DEVICE

(75) Inventors: Guo Chen, Shenzhen (CN); Shi-Wen Zhou, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 2 days.

(21) Appl. No.: 12/610,388

(22) Filed: Nov. 2, 2009

(65) Prior Publication Data

US 2011/0063802 A1 Mar. 17, 2011

(30) Foreign Application Priority Data

Sep. 17, 2009 (CN) .......................... 2009 1 0307152

(51) Int. Cl.
*H05K 7/20* (2006.01)
*G06F 1/20* (2006.01)

(52) U.S. Cl. ................... 361/719; 361/679.54; 361/704; 361/709; 361/710; 361/818; 165/80.3; 165/185; 174/16.3

(58) Field of Classification Search .................. 361/ 679.46–679.47, 679.54, 690, 703–704, 719, 361/709–710, 800, 816, 818; 165/80.2, 80.3, 165/185; 174/16.3
See application file for complete search history.

(56) References Cited

U.S. PATENT DOCUMENTS

| | | | | |
|---|---|---|---|---|
| 4,008,942 A * | 2/1977 | Grossi | ........................... | 439/328 |
| 5,699,229 A * | 12/1997 | Brownell | ....................... | 361/719 |
| 6,078,500 A * | 6/2000 | Beaman et al. | ............... | 361/704 |
| 6,246,584 B1 * | 6/2001 | Lee et al. | ....................... | 361/704 |
| 6,445,583 B1 * | 9/2002 | Kline et al. | ................... | 361/704 |
| 6,633,485 B1 * | 10/2003 | Sigl et al. | ....................... | 361/718 |
| 6,874,566 B1 * | 4/2005 | Artman et al. | ............... | 165/80.3 |
| 7,061,773 B2 * | 6/2006 | Chen | .............................. | 361/816 |
| 7,312,998 B2 * | 12/2007 | Kamemoto et al. | .......... | 361/719 |
| 7,782,617 B2 * | 8/2010 | Li et al. | ......................... | 361/700 |
| 2004/0201964 A1 * | 10/2004 | Sigl et al. | ....................... | 361/704 |
| 2005/0111196 A1 * | 5/2005 | Wang et al. | ................... | 361/719 |
| 2010/0296251 A1 * | 11/2010 | Chen et al. | .................... | 361/700 |
| 2011/0048681 A1 * | 3/2011 | Chen et al. | ............... | 165/104.26 |

FOREIGN PATENT DOCUMENTS

JP 58029844 A * 2/1983

* cited by examiner

*Primary Examiner* — Robert J Hoffberg
(74) *Attorney, Agent, or Firm* — Frank R. Niranjan

(57) ABSTRACT

A heat dissipation device is provided for dissipating heat generated by electronic components mounted on a printed circuit board in an electronic system. The electronic components have different heights. The heat dissipation device includes a connecting plate, at least two elastic members mounted on the connecting plate, and a heat sink having a substrate mounted on the connecting plate and located above one of the electronic components. A number of joining members extend through the printed circuit board and engage with the substrate to attach the substrate on the one electronic component on the printed circuit board. A distance between the substrate and the connecting plate is adjustable by adjusting the joining members to make the substrate intimately contact the one electronic component.

15 Claims, 6 Drawing Sheets

ELECTRONIC SYSTEM WITH HEAT DISSIPATION DEVICE

BACKGROUND

1. Technical Field

The present disclosure relates to an electronic system with a heat dissipation device thermally contacting a plurality of electronic components having different heights, to dissipate heat of the electronic components simultaneously.

2. Description of Related Art

Generally, a heat dissipation device thermally contacts electronic components mounted on a printed circuit board (PCB) to dissipate heat of the electronic components. The heat dissipation device comprises a base contacting the electronic components, and a plurality of fins extending upwardly from a top surface of the base. When the electronic components have different heights, the base of the heat dissipation device is not able to intimately contact all of the electronic components. As a result, a large thermal barrier exists between some of the electronic components and the base, which adversely affects the heat dissipation for such electronic components.

What is needed, therefore, is a heat dissipation device which can effectively dissipate heat generated by electronic components on a printed circuit board when the electronic components have different heights.

DETAILED DESCRIPTION

Figure 1:
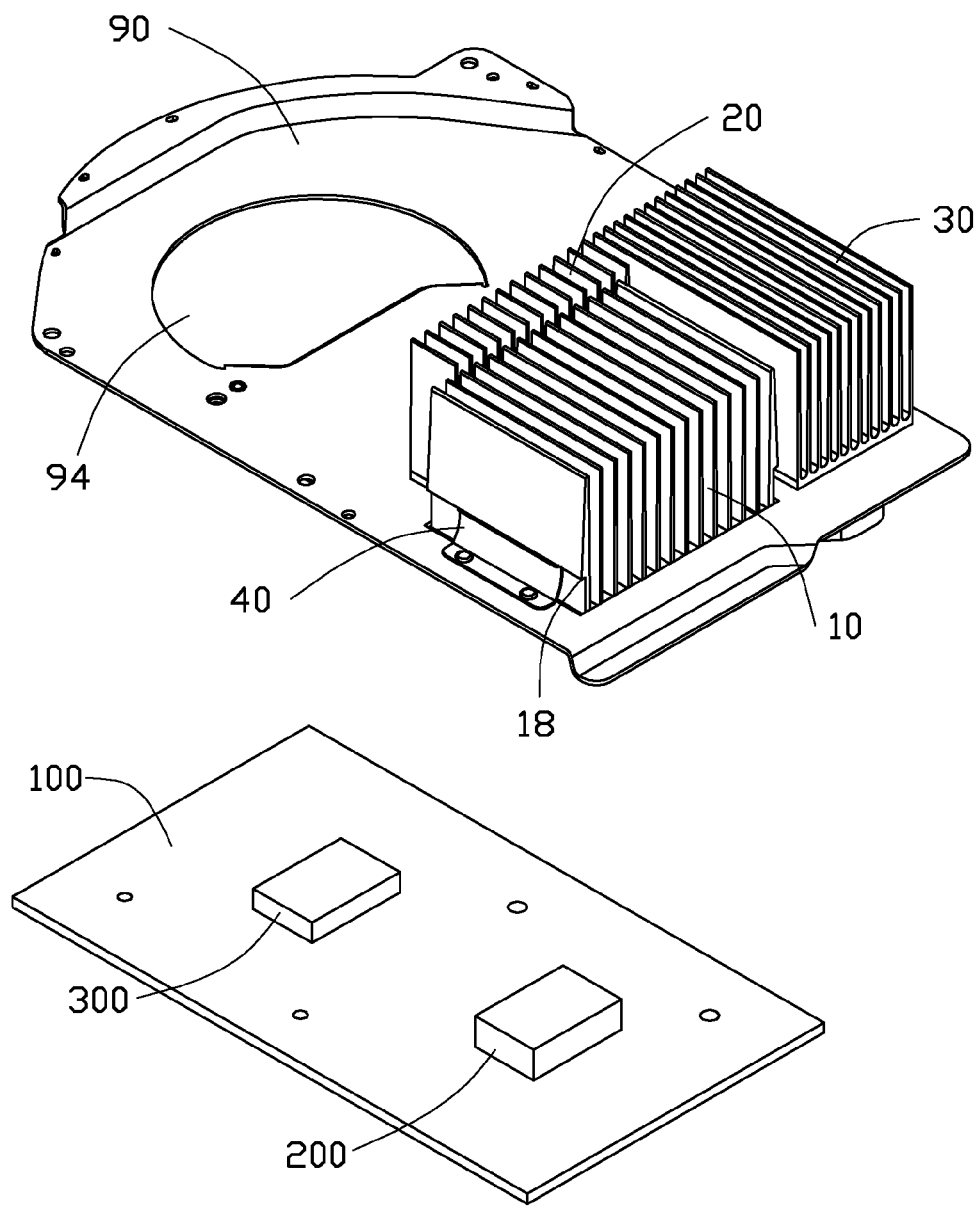
FIG. 1 is an assembled view of a heat dissipation device in accordance with an embodiment of the present disclosure, and a printed circuit board below the heat dissipation device.

FIG. 1 illustrates a heat dissipation device in accordance with an embodiment of the present disclosure. The heat dissipation device thermally contacts a first electronic component 200 and a second electronic component 300 mounted on a printed circuit board (PCB) 100 of an electronic device (not shown), to dissipate heat generated by the first and second electronic components 200, 300. In this exemplary embodiment, the electronic device is a game player; the first electronic component 200 is a central processing unit (CPU), and the second electronic component 300 is a graphic processing unit (GPU).

The heat dissipation device comprises a connecting plate 90, a first heat sink 10, a second heat sink 20, and a third heat sink 30. The first, second and third heat sinks 10, 20, 30 are engaged on the connecting plate 90. The first heat sink 10 thermally contacts the first electronic component 200. The second heat sink 20 thermally contacts the second electronic component 300. A heat pipe 50 thermally connects the second heat sink 20 and the third heat sink 30. In this embodiment, the connecting plate 90 electrically connects with an enclosure of the electronic device.

Figure 2:
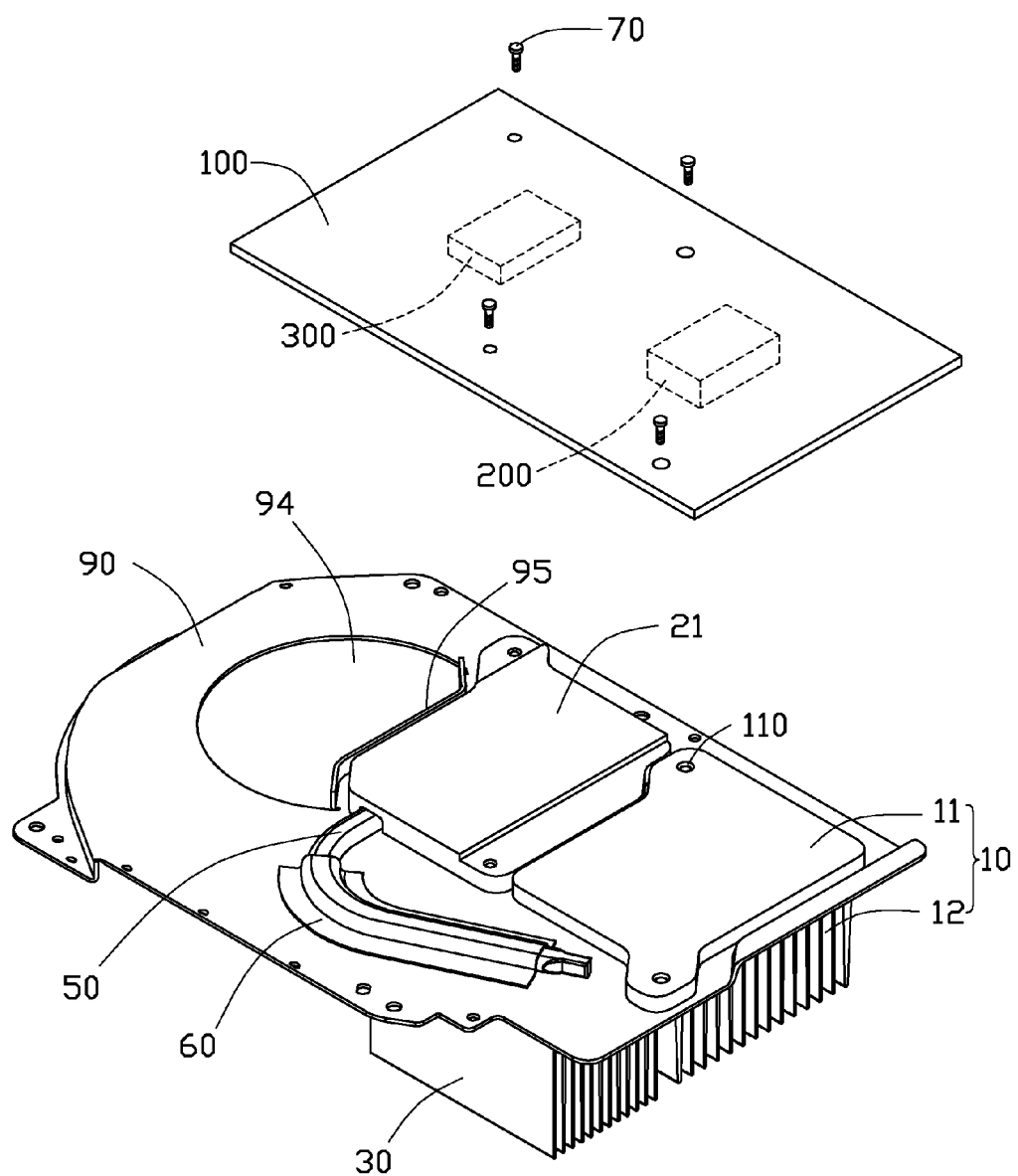
FIG. 2 is an inverted view of the heat dissipation device and printed circuit board of FIG. 1.
Figure 3:
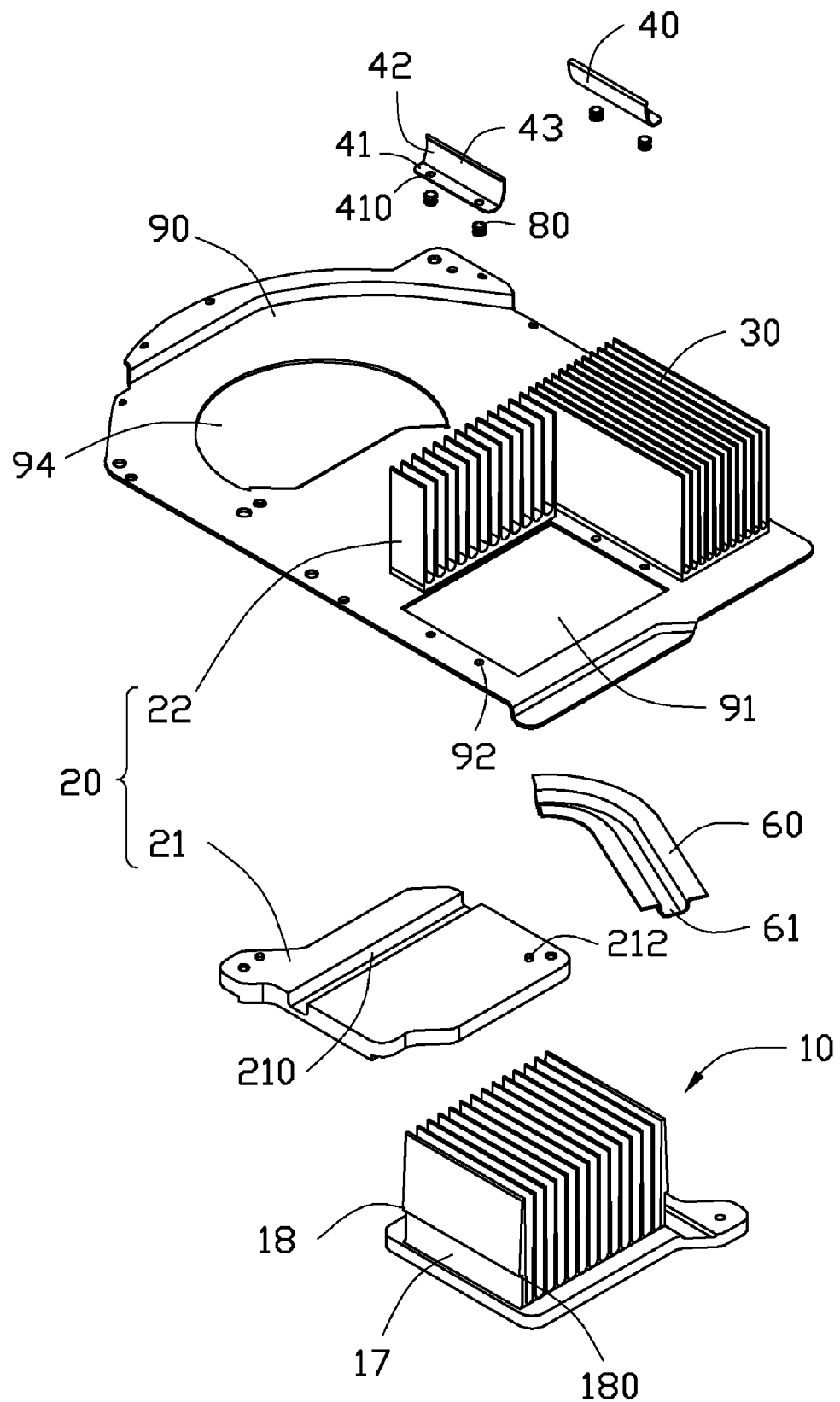
FIG. 3 is a partly exploded view of the heat dissipation device of FIG. 1.
Figure 4:
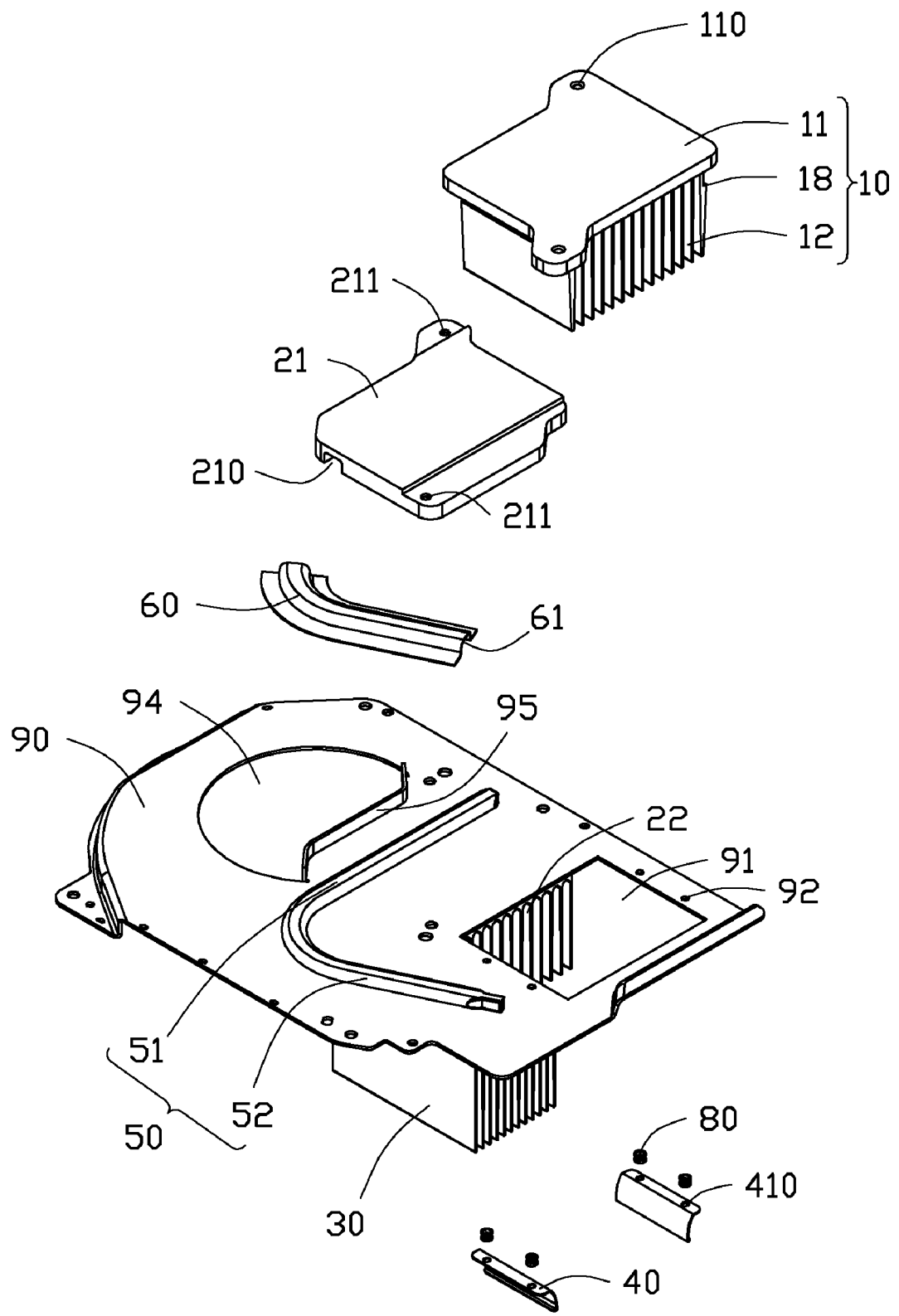
FIG. 4 is an inverted view of the heat dissipation device of FIG. 3.

Referring also to FIGS. 2-4, the connecting plate 90 is made of material having good thermal conductivity and electrical conductivity, and has a rectangular configuration. In this embodiment, the connecting plate 90 is a bottom fan cover for cooperation with a top fan cover (not shown) to guide airflow flowing to the heat sinks 10, 20, 30. A first end of the connecting plate 90 defines an approximately semicircular first opening 94 corresponding to a fan (not shown) which sucks airflow through the first opening 94 and blows airflow toward the heat sinks 10, 20, 30. A baffle 95 extends downwardly from an edge of the first opening 94 near the first heat sink 10. A second end opposite to the first end defines a rectangular second opening 91 to receive the first heat sink 10, and two pairs of through holes 92 at two opposite sides of the second opening 91.

The first heat sink 10 is an aluminum extrusion type heat sink, and has good thermal conductivity and electrical conductivity. The first heat sink 10 comprises a substrate 11 and a plurality of plate fins 12 integrally extending therefrom. The substrate 11 has a rectangular configuration, and defines two screw holes 110 at two diagonally opposite ends thereof. The plate fins 12 are parallel to each other to define a plurality of channels. When a fan is installed, ends of the channels face toward the fan, and airflow is for guided through the channels. Two engaging portions 18 extend outwardly from two opposite outermost plate fins 12 of the first heat sink 10, respectively. Each of the engaging portions 18 has an inclined outer surface (not labeled). A root 17 of each outermost plate fins 12 and a corresponding engaging portion 18 define an undercut 180. A distance between the two outermost plate fins 12 is slightly less than a width of the rectangular opening 91. The substrate 11 is larger than the rectangular opening 91; thus, the substrate 11 can abut a bottom surface of the connecting plate 90 when the first heat sink 10 is assembled to the connecting plate 90 to limit upright movement of the first heat sink 10.

The second heat sink 20 comprises a base 21 mounted at the bottom surface of the connecting plate 90, and a heat radiator 22 mounted on the connecting plate 90 and corresponding to the base 21. The heat radiator 22 is integrally made by aluminum extrusion. The second heat sink 20 is located at a middle portion of the connecting plate 90, between the first opening 94 and the second opening 91. The base 21 has a rectangular configuration and is made of material having good thermal conductivity. The base 21 has a lateral portion corresponding to the heat radiator 22 and another lateral portion defining a long groove 210 at a top thereof. The base 21 defines two screw holes 211 at two diagonally opposite ends thereof. The base 21 has two tabs 212 extending from near the screw holes 211 for orienting the base 21 to the connecting plate 90.

The third heat sink 30 is an aluminum extrusion type heat sink. The third heat sink 30 is mounted on the connecting plate 90 and located near the first and second heat sinks 10, 20. The heat pipe 50 is L-shaped and flattened. The heat pipe 50 comprises an evaporating section 51 received in the groove 210 of the base 21 of the second heat sink 20, and a condensing section 52 connecting with the evaporating section 51. The condensing section 52 thermally contacts the bottom surface of the connecting plate 90, to transfer heat to the connecting plate 90 and the second heat sink 20. A thermal cover 60 is mounted on the condensing section 52 of the heat pipe 50. The thermal cover 60 is made from a metal plate having good thermal conductivity. The thermal cover 60 has a generally omega-shaped (Ω-shaped) cross-section. A middle portion of the thermal cover 60 is protrudes downwardly to define a generally concave groove 61. An outer surface of the condensing section 52 of the heat pipe 50 can intimately contact the thermal cover 60 in the groove 61. Two lateral portions of the thermal cover 60 are attached to the bottom surface of the connecting plate 90, to transfer heat from the heat pipe 50 to the connecting plate 90. In addition, the thermal cover 60 can protect the heat pipe 50 from damage.

The elastic members 40 are mounted on the connecting plate 90 at two opposite sides of the second opening 91, to contact and support the first heat sink 10. Each elastic member 40 is made of sheet material having good electrical conductivity, and has a J-shaped configuration. Each elastic member 40 has a flat mounting portion 41 mounted on the connecting plate 90, an elastic middle portion 42, and an engaging portion 43. The mounting portion 41 defines two through holes 410 corresponding to the through holes 92. A plurality of fasteners, such as rivets 80, engage in the through holes 92, 410 to mount the elastic members 40 to the connecting plate 90. The middle portions 42 of the elastic members 40 intimately contact the roots 17 of the outermost plate fins 12 of the first heat sink 10.

Figure 5:
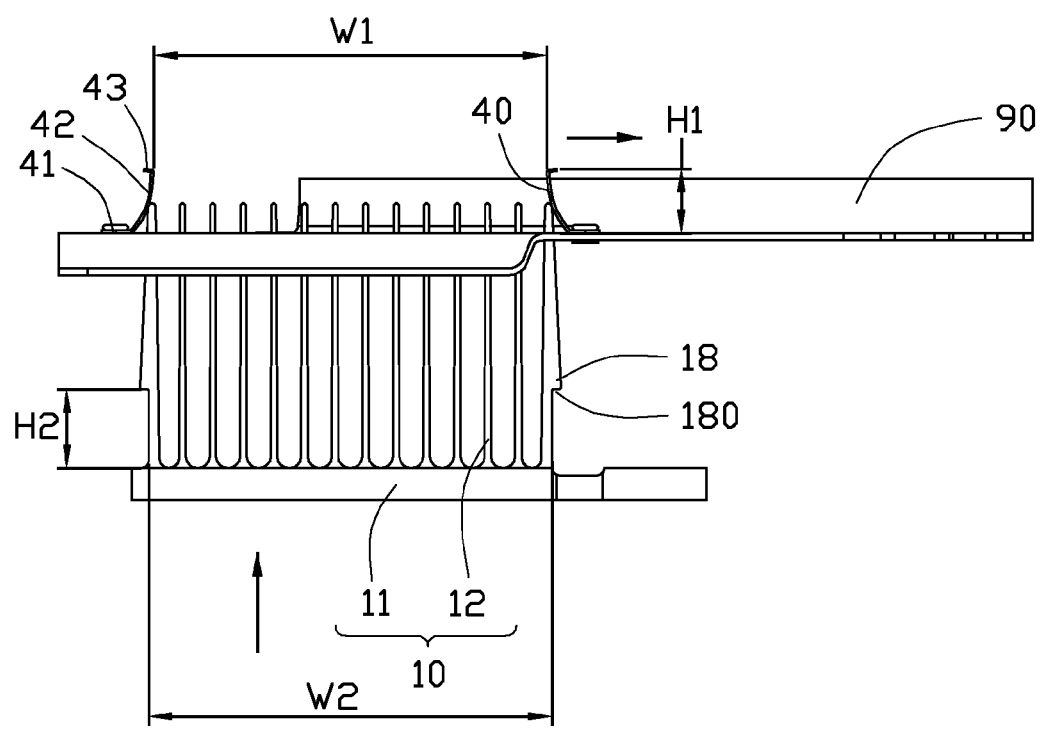
FIG. 5 is a side view of the heat dissipation device of FIG. 1, before a first heat sink of the heat dissipation device is attached to a connecting plate of the heat dissipation device.
Figure 6:
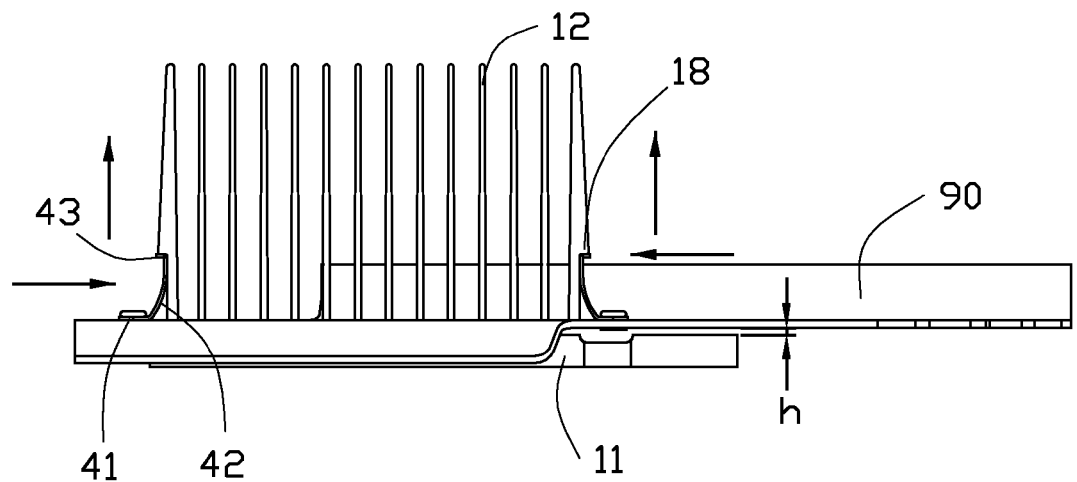
FIG. 6 is similar to FIG. 1, but showing the first heat sink attached to the connecting plate.

Referring also to FIGS. 5-6, the elastic members 40 are mounted at two opposite sides of the second opening 91 and face each other. The elastic middle portions 42 of the elastic members 40 incline toward the second opening 91. An inner distance W1 between the middle portions 42 of the elastic members 40 is less than an outer distance W2 between the roots 17 of the outermost plate fins 12. A height H1 of each elastic member 40 is less than a height H2 of each root 17. In assembly, when the first heat sink 10 begins to extend through the rectangular opening 91 of the connecting plate 90 from bottom to top, the elastic members 40 are pushed outwardly by the engaging portions 18 of the first heat sink 10. When the engaging portions 18 of the first heat sink 10 extend beyond tops of the elastic members 40, elastic forces afforded by the elastic members 40 make the elastic members 40 sandwich the first heat sink 10 and thereby mount the first heat sink 10 on the connecting plate 90. Since the distance W1 between the middle portions 42 is less than the distance W2 between the roots 17, the middle portions 42 of the elastic members 40 elastically abut against the roots 17 of the outermost plate fins 12. Since the height H1 of each elastic member 40 is less than a height H2 of each root 17, a gap h is defined between a top surface of the substrate 11 of the first heat sink 10 and the bottom surface of the connecting plate 90. Thus, a height of the substrate 11 relative to the connecting plate 90 is adjustable (see below), so that the substrate 11 can have good thermal contact with the first electronic component 200 of the PCB 100. In this state, the elastic members 40 always firmly contact the first heat sink 10, thereby maintaining electrical connection between the connecting plate 90 and the first heat sink 10.

After the second heat sink 20 is assembled on the PCB 100, the first heat sink 10 is assembled on the PCB 100 to thermally contact the first electronic component 200 of the PCB 100. Two joining members such as screws 70 extend through the PCB 100 and engage in the screw holes 110 of the substrate 11 to fix the first heat sink 10 on the PCB 100. When the first and second electronic components 200, 300 have different heights, a distance between the substrate 11 and the first electronic component 200 is adjustable by tightening or loosening the screws 70. The elastic members 40 retain the first heat sink 10 on the connecting plate 90 and enable the first heat sink 10 to move in a range corresponding to the gap h. The elastic members 40 intimately contact the roots 17 of the first heat sink 10 at whatever height the first heat sink 10 is adjusted to, thereby electrically connecting the connecting plate 90 with the first heat sink 10 to remove static electricity from the first and second electronic components 200, 300.

It is to be understood, however, that even though numerous characteristics and advantages of embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device comprising:

a connecting plate;

at least two elastic members mounted on the connecting plate; and a heat sink sandwiched by the at least two elastic members to be movable relative to the at least two elastic members and the connecting plate, the heat sink having a substrate located below the connecting plate and a plurality of fins extending through the connecting plate;

wherein a distance between the substrate and the connecting plate is adjustable; and wherein two opposite outermost fins of the plurality of fins of the heat sink each have an engaging portion extending therefrom to engage with one of the at least two elastic members.

2. The heat dissipation device of claim 1, wherein the at least two elastic members electrically connect the connecting plate with the heat sink.

3. The heat dissipation device of claim 1, wherein each outermost fin of the two opposite outermost fins of the heat sink further has a root connecting the substrate and the engaging portion, each elastic member of the at least two elastic members having a height less than a height of the root.

4. The heat dissipation device of claim 3, wherein the each elastic member of the at least two elastic members has a flat mounting portion mounted on the connecting plate and an elastic middle portion intimately contacting the root of one corresponding outermost fin of the two opposite outermost fins of the heat sink.

5. The heat dissipation device of claim 4, wherein an inner distance between the elastic middle portion of the each elastic member of the at least two elastic members is less than an outer distance between the roots of the two opposite outermost fins.

6. The heat dissipation device of claim 1, wherein the engaging portion has an inclined outer surface to engage a corresponding elastic member of the at least two elastic members.

7. The heat dissipation device of claim 1, wherein each elastic member of the at least two elastic members is made of sheet material having electrical conductivity, and has a J-shaped configuration.

8. The heat dissipation device of claim 1, wherein the connecting plate is a metallic plate.

9. The heat dissipation device of claim 1, wherein the connecting plate defines an opening for extension of the plurality of fins of the heat sink therethrough.

10. An electronic system comprising:
a printed circuit board;
a first electronic component and a second electronic component mounted on the printed circuit board, the first electronic component being shorter than the second electronic component;
a connecting plate;
at least two elastic members mounted on the connecting plate;
a heat sink sandwiched by the at least two elastic members to be movable relative to the at least two elastic members and the connecting plate, the heat sink having a substrate located above the first electronic component; and
a base mounted on the connecting plate and thermally contacting the second electronic component;
wherein a plurality of joining members extend through the printed circuit board and engage with the substrate and the base to attach the substrate and the base on the first and second electronic components on the printed circuit board, and the plurality of joining members assembling the substrate on the first electronic component are tightened to bias the substrate on the first electronic component, whereby the substrate has intimate thermal connection with the first electronic component.

11. The heat dissipation device of claim 10, wherein the at least two elastic members electrically connect the connecting plate with the heat sink.

12. The electronic system of claim 10, wherein the heat sink comprises a plurality of fins extending from the substrate, two opposite outermost fins of the plurality of fins each having an engaging portion extending therefrom to engage with one of the at least two elastic members.

13. The electronic system of claim 12, wherein each outermost fin of the two opposite outermost fins of the heat sink has a root connecting the substrate and the engaging portion, each elastic member of the at least two elastic members having a height less than a height of the root.

14. The electronic system of claim 13, wherein the each elastic member has a flat mounting portion mounted on the connecting plate and an elastic middle portion intimately contacting the root of the each outermost fin of the two opposite outermost fins of the heat sink.

15. The electronic system of claim 10, wherein each elastic member of the at least two elastic members is made of sheet material having electrical conductivity, and has a J-shaped configuration.

* * * * *